United States Patent
Donkin et al.

(10) Patent No.: US 12,342,671 B1
(45) Date of Patent: Jun. 24, 2025

(54) TIR CLUSTER FOR COLOR MIXING

(71) Applicant: LMPG Inc., Longueuil (CA)

(72) Inventors: Caroline Donkin, Longueuil (CA); David Grassi, Pointe-Claire (CA)

(73) Assignee: LMPG INC., Longueuil (CA)

( * ) Notice: Subject to any disclaimer, the term of this patent is extended or adjusted under 35 U.S.C. 154(b) by 0 days.

(21) Appl. No.: 18/938,871

(22) Filed: Nov. 6, 2024

(51) Int. Cl.
  *H01L 27/15* (2006.01)
  *H10H 29/14* (2025.01)
  *H10H 29/855* (2025.01)

(52) U.S. Cl.
  CPC ........ *H10H 29/142* (2025.01); *H10H 29/855* (2025.01)

(58) Field of Classification Search
  None
  See application file for complete search history.

(56) References Cited

U.S. PATENT DOCUMENTS

| | | | |
|---|---|---|---|
| 2008/0123057 A1* | 5/2008 | Williamson | G03B 21/208 353/30 |
| 2016/0138777 A1* | 5/2016 | Shen | G02B 19/0061 362/308 |
| 2021/0105873 A1* | 4/2021 | Francis | H05B 45/20 |
| 2023/0288044 A1* | 9/2023 | Grassi | F21V 5/007 |

* cited by examiner

*Primary Examiner* — Robert K Carpenter
(74) *Attorney, Agent, or Firm* — ArentFox Schiff LLP; Joseph M. Maraia

(57) ABSTRACT

Aspects of the present disclosure include a light emitting diode (LED) module including a plurality of LEDs, each of the plurality of LEDs being spaced apart from one or more neighboring LEDs by a spacing, a plurality of optics each disposed over a corresponding LED of the plurality of LEDs, each of the plurality of optics having a radius, and a plurality of LED chips disposed within the plurality of LEDs and each having a LED light emitting surface having one or more sides with a length, wherein a ratio of the spacing, the radius, and the length is configured to cause a light emitted from the LED engine to be narrower than 14 degrees and with a relative Cd/lm greater than 10 and with a measured application color uniformity of less than 0.005 $Du'v'$.

20 Claims, 5 Drawing Sheets

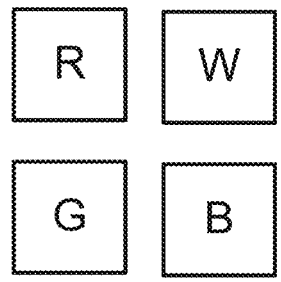
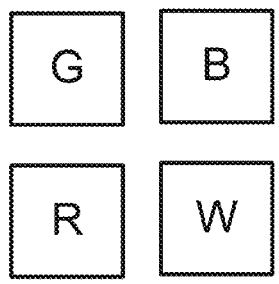
FIG. 5

TIR CLUSTER FOR COLOR MIXING

BACKGROUND

Lighting apparatuses (e.g., a grazing fixture, an accent light, and/or an architectural luminaire) such as light emitting diode (LED) lighting panels, are used prevalently in various industrial, commercial, and/or residential applications. For example, a lighting panel may be used to illuminate a side of a building, accent a wall, and/or project images and/or messages. These lighting panels may be implemented with discrete LEDs with narrow beam angles or LED clusters with large optics and/or large beam angles. For discrete LED solutions, overlaying the LEDs with a single total internal reflection (TIR) optic may obtain narrow beam angle (as desired). However, in color changing configurations, the discrete LED solutions may provide poor color mixings. This may be apparent in linear products at the extremities of the fixture.

LED cluster solutions may provide good color mixings, but the TIR optic may need to be a certain size to obtain narrow beam angles. For these lighting panels with LED clusters, it may be desirable to reduce the size of the optics in the LED engines to improve color mixings. However, over-reduction to the optics size may cause certain deleterious effects such as diminished control of the distribution of the luminaire. Therefore, improvements may be desirable.

SUMMARY

This summary is provided to introduce a selection of concepts in a simplified form that are further described below in the DETAILED DESCRIPTION. This summary is not intended to identify key features of the claimed subject matter, nor is it intended to be used as an aid in determining the scope of the claimed subject matter.

In order to resolve the challenges above, the current application discloses a LED engine configured to effectively mix the colors of multiple LEDs in a limited footprint while still maintaining control of the angle of emission. Specifically, the LED engine disclosed herein achieves color mixing at a closer distance (from the LEDs) by reducing the size of the optics. As such, aspects of the present disclosure overcome the difficulty of insufficient distance between the lighting engine and the application surface for the light to be adequately mixed. The outer TIR surfaces are maintained at a particular distance from the LEDs to achieve performance and precision in emission angle and fringe colors. The center of the TIR optics may be fused to enhance mixing of the colors from the multiple LEDs. As such, the LED engine of the current application includes the advantages of both a discrete LED engine and a LED cluster, including shorter color mixing, control over emission angle, and reduced unmixed light beams near the edge of the emission.

Aspects of the present disclosure include a light emitting diode (LED) module including a plurality of LEDs, each of the plurality of LEDs being spaced apart from one or more neighboring LEDs by a spacing, a plurality of optics each disposed over a corresponding LED of the plurality of LEDs, each of the plurality of optics having a radius, and a plurality of LED chips disposed within the plurality of LEDs and each having a LED light emitting surface having one or more sides with a length, wherein a ratio of the spacing, the radius, and the length of the LED emission surface is configured to cause a light emitted from the LED engine to be narrower than 14 degrees and with a relative Cd/lm greater than 10 and with a measured application color uniformity of less than 0.005 $Du^1v^1$.

BRIEF DESCRIPTION OF THE DRAWINGS

The features believed to be characteristic of aspects of the disclosure are set forth in the appended claims. In the description that follows, like parts are marked throughout the specification and drawings with the same numerals, respectively. The drawing figures are not necessarily drawn to scale and certain figures may be shown in exaggerated or generalized form in the interest of clarity and conciseness. The disclosure itself, however, as well as a mode of use, further objects and advantages thereof, will be best understood by reference to the following detailed description of illustrative aspects of the disclosure when read in conjunction with the accompanying drawings, wherein:

FIG. 5 illustrates patterns for arranging red, green, blue, and white LEDs in the LED engine according to aspects of the present disclosure.

DETAILED DESCRIPTION

Figure 1:
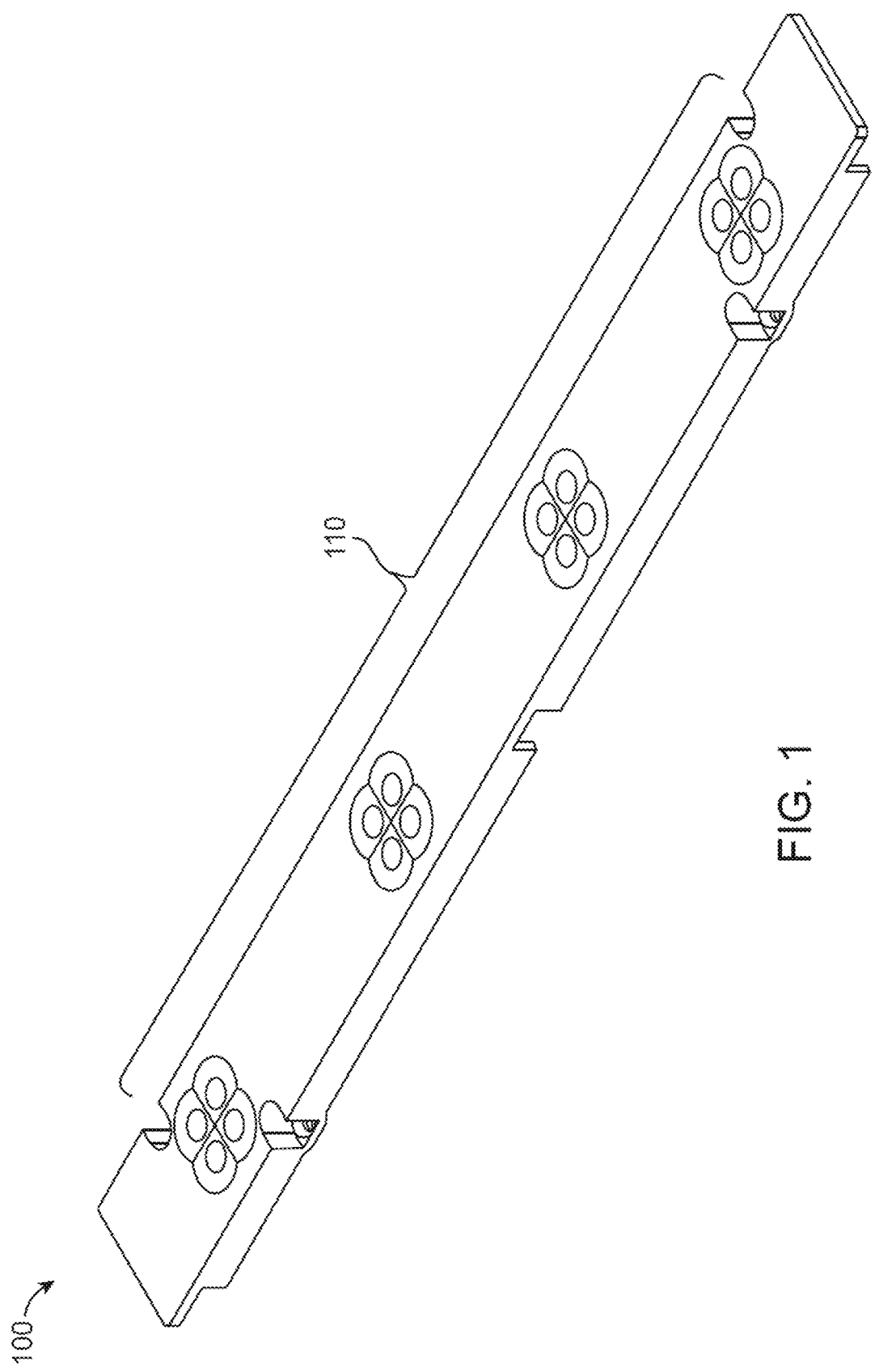
FIG. 1 illustrates a perspective view of a lighting panel according to aspects of the present disclosure.

Aspects of the present disclosure include a lighting panel having light emitting diode (LED) engines. Each LED engine may include a group of LEDs disposed within the LED engine. Specifically, the LED engine may have desirable spacings between and among two or more LEDs. Further, the optics for the lighting LED engines may have desirable sizes. In one aspect of the present disclosure, the spacing between neighboring LEDs in a LED engine, the optic radius, and the LED light emitting surface (e.g., the diameter, the diagonal, the edge) may have a ratio of substantially 1:0.75:0.125. The ratio may be substantially 8:6:1, 9:6:1, 8:5:1, 7:5:1, or other suitable ratios.

In an aspect of the present disclosure, the ratio or ration range may cause the LED engine to emit light emitted from the LED engine to be narrower than 14 degrees and with a relative Cd/lm greater than 10 and with a measured application color uniformity of less than 0.005 $Du^1v^1$.

In a non-limiting example, the spacing between neighboring LEDs may be between 4-10 millimeters (mm). In one aspect of the present disclosure, the spacing may be 8 mm. In some examples, the optic radius of the LED engine may be between 3-7 mm. In an aspect of the present disclosure, the optic radius may be 6 mm. In some aspects, the LED light emitting surface may be 0.5-2 mm. In certain aspects, the LED light emitting surface may be 1 mm.

In designing LED engines, various factors may be considered to achieve the desired effect. Certain parameters associated with the LED engines may require optimizations. Importantly, changing one parameter may impact other parameters.

In one example, the reduction of the size of optics may cause color mixing (if any) to occur faster because far field conditions may be reached within a shorter distance. In another example, the target beam angle may influence far field conditions. In an example, the spacings between the LEDs may impact any color mixing (e.g., smaller spacings may cause faster mixing). In some examples, the geometry and/or the size of the LEDs may also impact the outcome. For example, a line of optics and/or LEDs may have certain advantages, but the TIR coverage may be inconsistent and/or cause certain colors to appear more than others on a target surface. In another example, the LEDs may be arranged in a staggered pattern, or in a grid pattern. Other patterns are also possible according to aspects of the present disclosure.

Aspects of the present disclosure include using the joined portions of the TIR optics (also known as TIRs or optics) for blending the colors of light. Specifically, aspects of the present disclosure include using joined portions of the TIR to achieve optimal color mixing close to the luminaire (e.g., in the near field). The outer individual TIR surfaces may be used for optical control (e.g., to achieve narrow beam angle). For the application of illuminating a large surface (e.g., wall of a building) the center blended section may be used to illuminate the lower portion of the wall (e.g., bottom half of the wall), reaching far field conditions faster because the blending by the TIRs and the proximity of the individual LEDs. The TIR side walls may be used to blend and/or illuminate the higher portion of the wall (e.g., upper half of the wall).

FIG. 1 illustrates a perspective view of a lighting panel according to aspects of the present disclosure. A lighting panel 100 may include a plurality of LED engines 110. In FIG. 1, the plurality of LED engines 110 includes four LED engines. However, other number of LED engines may also be implemented in the lighting panel 100 according to aspects of the present disclosure. In some aspects of the present disclosure, each LED engine of the plurality of LED engines 110 may include LEDs configured to provide illumination. The lighting panel 100 may be disposed in a lighting fixture (not shown), along with one or more of a collimator, a diffuser (e.g., holographic, volumetric, molded or extruded), sealing lens, controlling circuitry, power supplies, and/or other optical components.

Figure 2:
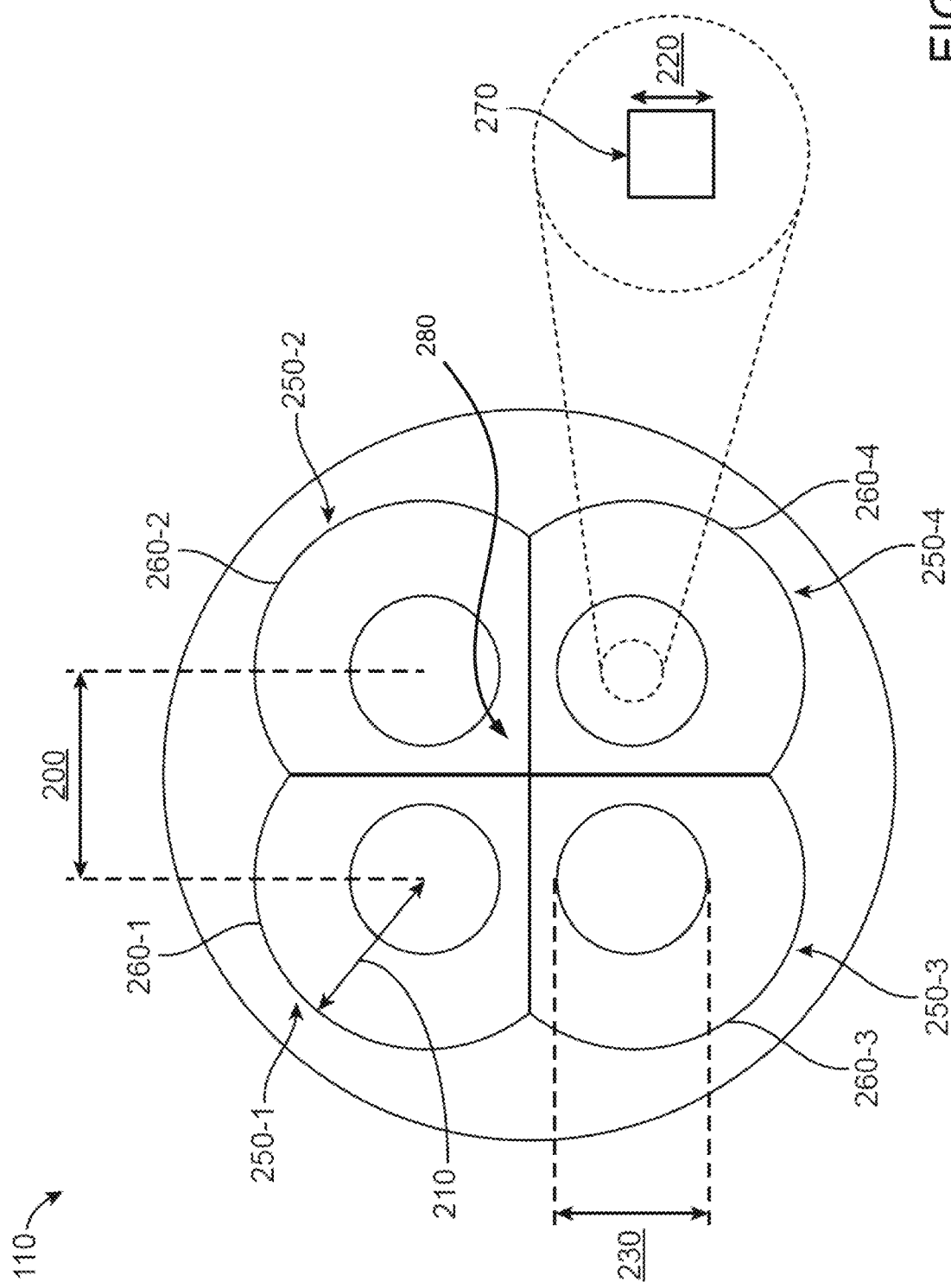
FIG. 2 illustrates a top view of a LED engine according to aspects of the present disclosure.

FIG. 2 illustrates a top view of a LED engine according to aspects of the present disclosure. The LED engine 110 may include a plurality of LEDs 250. The plurality of LEDs 250 may be Red-Green-Blue-White (RGBW) quad LEDs. In one aspect, individual clusters of red, green, blue, and/or white LEDs may be used. In another aspect, a single red, green, blue, and/or white LED may be used the LED engine 110. In other aspects, different numbers (e.g., 1, 3, 5, 6, etc.), types (e.g., yellow LED), and/or combination of LEDs (e.g., RGB only) may be used according to aspects of the present disclosure. Each LED of the plurality of LEDs 250 may include a LED chip of a plurality of LED chips 270 disposed in the middle of the corresponding LED. The plurality of LED chips 270 may be configured to emit one or more of red, yellow, green, blue, white lights. Other colors may also be emitted. In some aspects, micro-LED technology may also be used in place of the LED chips.

In some aspects, the LED engine 110 may include a plurality of optics 260 associated with the plurality of LEDs 250. In one aspect, each one of the plurality of optics 260 may be associated with a corresponding LED of the plurality of LEDs 250. Each of the optic of the plurality of optics 260 may be configured to guide the lights emitted from the corresponding LED of the plurality of LEDs 250. In some aspects, the plurality of optics 260 may be configured to emit, mix, focus, and/or disperse lights emitted from the plurality of LEDs 250 as described below.

In the LED engine 110 shown in FIG. 2, the plurality of LEDs 250 include four LEDs arranged in a square pattern. Other patterns and/or number of LEDs may also be implemented according to aspects of the present disclosure. For example, the LEDs may be arranged in a staggered, linear, hexagonal, triangular, and/or other patterns. The number of LEDs may be 2, 3, 4, 6, 8, or other numbers.

In one aspect of the present disclosure, each LED of the plurality of LEDs 250 may be spaced apart from the neighboring LEDs by a spacing 200. In certain aspect, the spacing 200 may be between 4-10 mm, 2-14 mm, 6-8 mm, 5-9 mm, or other ranges. In one aspect of the present disclosure, the spacing 200 may be substantially 8 mm. For example, the center of the LED 250-1 may be spaced 4-10 mm apart from the center of the LED 250-2 and/or the LED 250-3. In one aspect, the center of the LED 250-1 may be spaced 8 mm apart from the center of the LED 250-2 and/or the LED 250-3.

In certain aspects of the present disclosure, each optic of the plurality of optics 260 may have a radius 210 between 3-7 mm, 5-6 mm, 2-8 mm, or other ranges. In one aspect of the present disclosure, the optic radius 210 may be 6 mm. The plurality of optics 260 may overlap partially. In some aspects, the plurality of optics 260 may be fused into a single optical component. In other aspects, the plurality of optics 260 may be separate optical components. Each of the plurality of optics 260 may be optionally texturized to improve dispersion of lights, mixing of lights, and/or other functionalities. The texturized region of each of the plurality of optics 260 may have a diameter 230 of 4-8 mm. In one aspect, the diameter 230 may be substantially 6 mm, or 5.87 mm.

In some aspects, the plurality of LED chips 270 may have a light emitting surface. The light emitting surface may be a square having four sides having a length 220. The length 220 may be between 0.5-1.5 mm, 1 to 1.4 mm, 0.2-2 mm, or other suitable range. In one aspect, the length 220 of each of the four sides of the light emitting surface may be 1 mm. In other aspects, the light emitting surface of each of the plurality of LED chips 270 may have a dimension of 1 mm. The dimension may be a diameter (for circular light emitting surface), a diagonal, and/or a side.

In certain aspects of the present disclosure, a joined portion 280 of plurality of optics 260 may be fused together. The joined portion 280 may help blending the lights emitted from the LEDs 250. After blending the lights, the joined portion 280 may accelerate the emitted lights in reaching far field emission condition.

Figure 3:
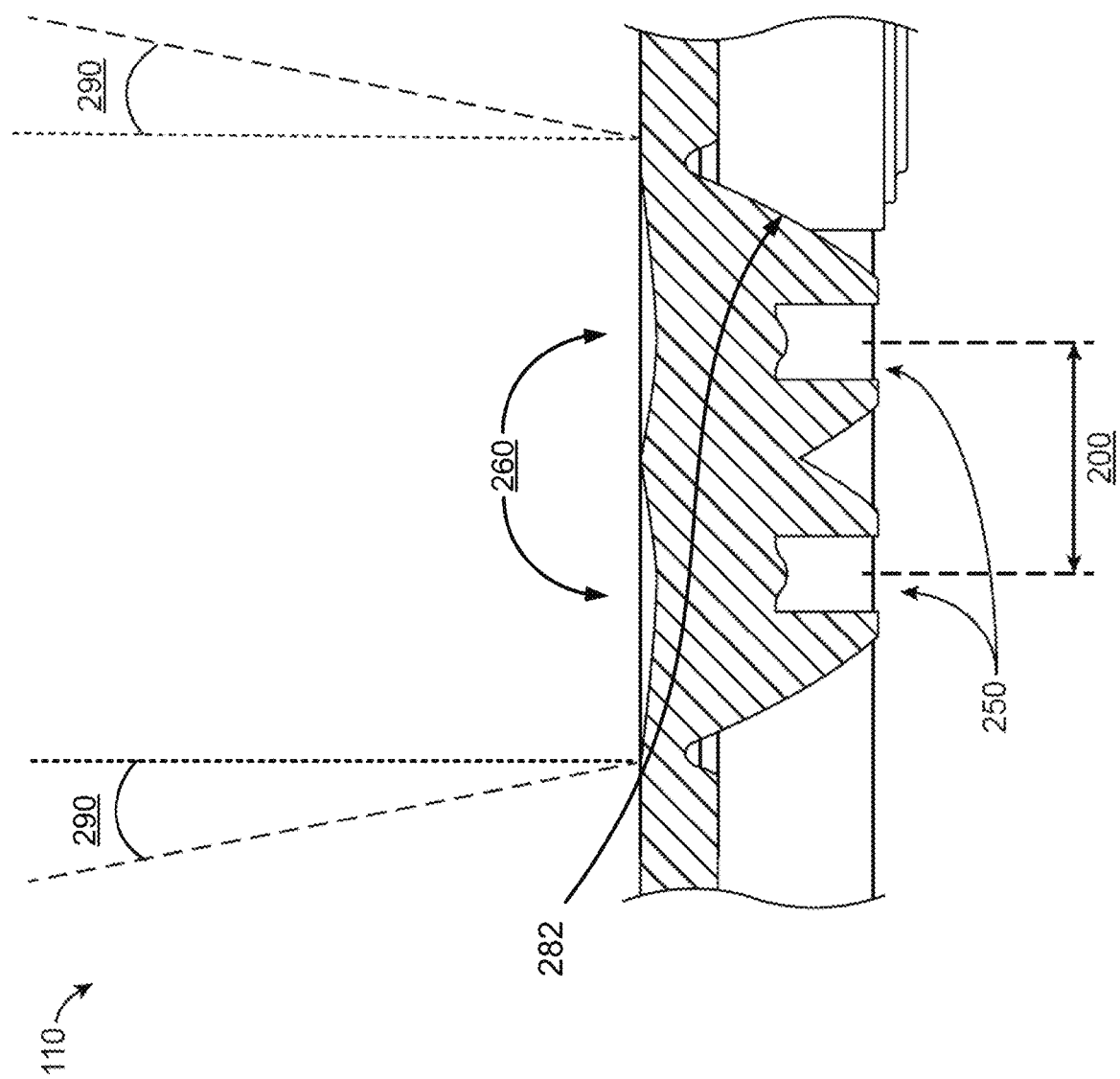
FIG. 3 illustrates a side view of the LED engine of FIG. 2.

FIG. 3 illustrates a side view of the LED engine of FIG. 2. In some aspects of the present disclosure, the plurality of LEDs 250 of the LED engine 110 may emit lights away from the surface of the LED engine 110. The LED engine 110 may emit the lights in a conical shape away from the LED engine 110. In one aspect, the LED engine 110 may emit the lights at an angle 290 normal to the surface of the LED engine 110. The angle 290 may be the half angle (from zenith) of the emission. In one aspect, the combined angles of 290 on both sides may be less than 15°, 13°, 10° or less. Other angle values are also possible.

In certain aspects of the present disclosure, internal sidewalls 282 of the plurality of LEDs 250 and/or the plurality of optics 260 may be used to the angle 290. In some instances, the internal sidewalls 282 may prevent the angle 290 from being too large (e.g., larger than 30°, 35°, or more). Further, the internal sidewalls 282 may improve the blending of the lights in far field conditions.

In some aspects, the ratio of the spacing 200, the radius 210, and the length 220 of the LED emission surface may be configured to cause a light emitted from the LED engine 110 to be narrower than 15 degrees, 13 degrees, 10 degrees, or less. The ratio of the spacing 200, the radius 210, and the length 220 of the LED emission surface may be configured to cause a light emitted from the LED engine 110 to have a relative beam width greater than 15, 12, 10, 8, or 5 Cd/lm. The ratio of the spacing 200, the radius 210, and the length 220 of the LED emission surface may be configured to cause a light emitted from the LED engine 110 to have a measured application color uniformity of less than 0.007, 0.005, or 000.3 $Du^1v^1$. Other performance metrics may also be achieved with the ratio and/or ratio range described above.

Figure 4:
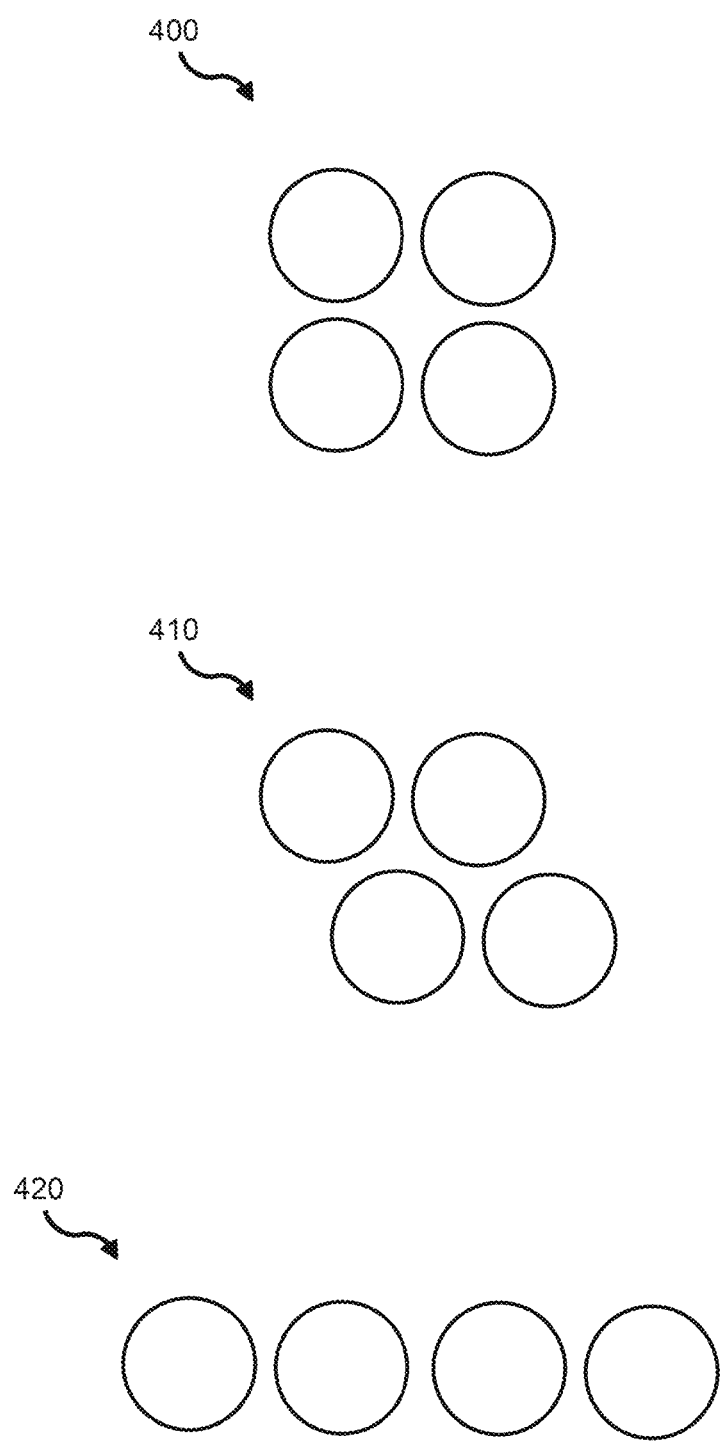
FIG. 4 illustrates various patterns for arranging the LEDs in the LED engine.

FIG. 4 illustrates various patterns for arranging the LEDs in the LED engine. FIG. 4 illustrates a square pattern 400, an offset pattern 410, and a linear pattern 420. Other patterns and number of LEDs may also be implemented according to aspects of the present disclosure.

FIG. 5 illustrates patterns for arranging red, green, blue, and white LEDs in the LED engine. A first pattern 500 includes a red LED or LED cluster R, a green LED or LED cluster (G), a blue LED or LED cluster (B), and a white LED or LED cluster (W). Here, the first pattern 500 may be arranged such that the green LED or LED cluster is opposite of the white LED or LED cluster. The red LED or LED cluster may be disposed next to the green LED or LED cluster to improve color cancellation. The white LED or LED cluster may be adjacent to the red LED or LED cluster and the blue LED or LED cluster to achieve a softer color.

A second pattern 510 may also include R, G, B, and W LEDs/clusters. The second pattern 510 shows an alternative arrangement of the LEDs that fits the criteria described above relating to the first pattern 500. Other numbers of LEDs, types of LEDs, and/or arrangements for the LEDs may also be implemented according to aspects of the present disclosure.

It will be appreciated that various implementations of the above-disclosed and other features and functions, or alternatives or varieties thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A light emitting diode (LED) module, comprising:
   a plurality of LEDs, each of the plurality of LEDs being spaced apart from one or more neighboring LEDs by a spacing;
   a plurality of optics each disposed over a corresponding LED of the plurality of LEDs, each of the plurality of optics having a radius; and
   a plurality of LED chips disposed within the plurality of LEDs and each having a LED light emitting surface having one or more sides with a length;
   wherein a ratio of the spacing, the radius, and the length is configured to cause a light emitted from the LED engine to be narrower than 14 degrees and with a relative Cd/lm greater than 10 and with a measured application color uniformity of less than 0.005 $Du^1v^1$.

2. The LED engine of claim 1, wherein the spacing is between 5 to 9 millimeters (mm).

3. The LED engine of claim 2, wherein the spacing is substantially 8 mm.

4. The LED engine of claim 1, wherein the radius is between 4 to 6 millimeters (mm), inclusive.

5. The LED engine of claim 4, wherein the radius is substantially 6 mm.

6. The LED engine of claim 1, wherein ratio of the spacing, the radius, and the length is substantially 8:6:1.

7. The LED engine of claim 1, wherein the LED light emitting surface is a square and the length is 1 millimeters (mm).

8. The LED engine of claim 1, wherein the plurality of LEDs include four LEDs.

9. The LED engine of claim 8, wherein the plurality of LEDs include a red LED, a green LED, a blue LED, and a white LED.

10. The LED engine of claim 8, wherein the plurality of LEDs are arranged in a square pattern.

11. A lighting panel, comprising:
    a plurality of light emitting diode (LED) modules disposed linearly along the lighting panel, each LED engine comprising:
    a plurality of LEDs, each of the plurality of LEDs being spaced apart from one or more neighboring LEDs by a spacing;
    a plurality of optics each disposed over a corresponding LED of the plurality of LEDs, each of the plurality of optics having a radius; and
    a plurality of LED chips disposed within the plurality of LEDs and each having a LED light emitting surface having one or more sides with a length;
    wherein a ratio of the spacing, the radius, and the length is configured to cause a light emitted from the LED engine to be narrower than 14 degrees and with a relative Cd/lm greater than 10 and with a measured application color uniformity of less than 0.005 $Du^1v^1$.

12. The lighting panel of claim 11, wherein the spacing is between 5 to 9 millimeters (mm).

13. The lighting panel of claim 12, wherein the spacing is substantially 8 mm.

14. The lighting panel of claim 11, wherein the radius is between 4 to 6 millimeters (mm), inclusive.

15. The lighting panel of claim 14, wherein the radius is substantially 6 mm.

16. The lighting panel of claim 11, wherein ratio of the spacing, the radius, and the length is substantially 8:6:1.

17. The lighting panel of claim 11, wherein the LED light emitting surface is a square and the length is 1 millimeters (mm).

18. The lighting panel of claim 11, wherein the plurality of LEDs include four LEDs.

19. The lighting panel of claim 18, wherein the plurality of LEDs include a red LED, a green LED, a blue LED, and a white LED.

20. The lighting panel of claim 18, wherein the plurality of LEDs are arranged in a square pattern.

* * * * *